United States Patent [19]
Merritt et al.

[11] Patent Number: 5,936,428
[45] Date of Patent: *Aug. 10, 1999

[54] LOW POWER, HIGH SPEED LEVEL SHIFTER

[75] Inventors: Todd A. Merritt; Troy A. Manning, both of Boise, Id.

[73] Assignee: Micron Technology, Inc., Boise, Id.

[*] Notice: This patent is subject to a terminal disclaimer.

[21] Appl. No.: 09/146,304

[22] Filed: Sep. 3, 1998

Related U.S. Application Data

[60] Division of application No. 08/890,921, Jul. 10, 1997, Pat. No. 5,666,070, which is a continuation-in-part of application No. 08/438,645, May 10, 1995, Pat. No. 5,528,173.

[51] Int. Cl.$^6$ .............................................. H03K 19/0185
[52] U.S. Cl. ................................. 326/81; 326/68
[58] Field of Search ................................. 326/62, 68, 71, 326/80–81, 73, 83, 86, 121; 327/534–535

[56] References Cited

U.S. PATENT DOCUMENTS

| | | |
|---|---|---|
| 4,897,565 | 1/1990 | Shimizu . |
| 4,920,284 | 4/1990 | Denda . |
| 4,977,339 | 12/1990 | Denda . |
| 5,225,721 | 7/1993 | Gal et al. . |
| 5,245,228 | 9/1993 | Harter . |
| 5,451,888 | 9/1995 | Shimada ................................ 326/80 |
| 5,528,173 | 6/1996 | Merritt et al. ........................ 326/80 |
| 5,539,334 | 7/1996 | Clapp, III et al. .................... 326/80 |
| 5,666,070 | 9/1997 | Merritt et al. ........................ 326/81 |

FOREIGN PATENT DOCUMENTS

| | | |
|---|---|---|
| 1-109824 | 4/1989 | Japan . |
| 2-54615 | 2/1990 | Japan . |
| 6-204850 | 7/1994 | Japan . |

*Primary Examiner*—Jon Santamauro
*Attorney, Agent, or Firm*—Schwegman, Lundberg, Woessner & Kluth P.A.

[57] ABSTRACT

A voltage level translator is disclosed which translates a CMOS input signal into a CMOS output signal where the low voltage level of the output signal is equal to the high voltage level of the input signal. The voltage level translator is described in an integrated circuit such as memory circuits, including DRAMs. Specifically, the voltage level translator produces an output signal which can be used as a gate voltage on a precharge transistor for a booted circuit where the gate voltage need only drop to the high voltage level of the input signal to shut the transistor off. The voltage level translator described, therefore, reduces the time and power required to translate an input signal by limiting the voltage swing of the output signal.

8 Claims, 9 Drawing Sheets

LOW POWER, HIGH SPEED LEVEL SHIFTER

This application is a divisional of U.S. patent application Ser. No. 08/809,921, filed Jul. 10, 1997 now 5,666,070 (the '921 Application). The '921 application is incorporated herein by reference, which is a continuation-in-part of U.S. patent application Ser. No. 08/438,645, filed May 10, 1995 now 5,528,173.

TECHNICAL FIELD OF THE INVENTION

The present invention relates generally to integrated circuits and in particular the present invention relates to voltage level translators fabricated thereon.

BACKGROUND OF THE INVENTION

There are instances in integrated circuit design where voltage level translators are needed to interface between circuits requiring different voltage levels. For example, many integrated circuits such as DRAMs operate in a voltage range <4 volts, but require voltage swings >4 volts to interface with external circuits or provide signals to other circuits included with the DRAM.

Two primary objectives of any voltage level translator are the reduction in time required to translate an input signal and the power requirements to complete the translation. A CMOS voltage translator described in U.S. Pat. No. 5,136,190 entitled "CMOS Voltage Level Translator Circuit" issued to Chern et al., addresses these two objectives. The Chern et al. patent describes a circuit which provides an interface between circuitry where control signals are between Vcc and V.s. to circuits using signals between Vcc' and V.s. Specifically, the Chern et al. level translator works in integrated circuits where Vcc is <4 volts and Vcc' is >4 volts.

Although the Chern et al. patent provides a fast, efficient level translator, it fails to address interfaces requiring voltage swings between a supply voltage (Vcc) and some higher voltage (Vccp). That is, Chern et al. describes a level translator which translates an input voltage swing from ground (V.s.) to supply (Vcc) into an output voltage swing from V.s. to Vccp. This translator is relatively slow and wastes power in interfacing with a circuit which requires an input voltage swing between Vcc and Vccp. It can be seen that the transition time and power required to move the output voltage between V.s. and Vcc is an unnecessary use of resources.

For the reasons stated above, and for other reasons stated below which will become apparent to those skilled in the art upon reading and understanding the present specification, there is a need in the art for an integrated circuit voltage level translator which can translate an input voltage signal into an output voltage signal where the minimum output voltage level is substantially equal to the maximum input voltage level.

SUMMARY OF THE INVENTION

The above mentioned problems with voltage level translators and other problems are addressed by the present invention and which will be understood by reading and studying the following specification. A level translator is described which provides an output voltage between ground and a lower voltage Vbb.

In particular, the present invention describes a voltage level translator comprising an input connection receiving an input signal having a first upper voltage level and a first lower voltage level, an input stage producing first and second intermediate outputs. The first intermediate output being at substantially the first upper voltage level when the input signal is at substantially the first lower voltage level. The second intermediate output being at the first upper voltage level when the input signal is at the first upper voltage level. The voltage level translator further comprises an output stage producing an output signal in response to the input signal, the output signal being at a second lower voltage level when the first intermediate output is at substantially the first upper voltage level, and at the first lower voltage level when the second intermediate output is at substantially the first upper voltage level. The output stage comprises a first n-channel transistor having its gate connected to the first intermediate output, its source electrically connected to the second lower voltage level, and its drain connected to a source of a second n-channel transistor. The second n-channel transistor has its gate connected to the second intermediate output, and its drain electrically connected to the first lower voltage level. The output stage further comprises an output line connected to the drain of the first n-channel transistor.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Each transistor described herein is either a P-channel or N-channel field-effect transistor (FET) having a gate, a first current node (drain) and a second current node (source). Since an FET is typically a symmetrical device, the true designation of "source" and "drain" is only possible once a voltage is impressed on the terminals. The designations of source and drain herein should be interpreted, therefore, in the broadest sense.

Figure 1:
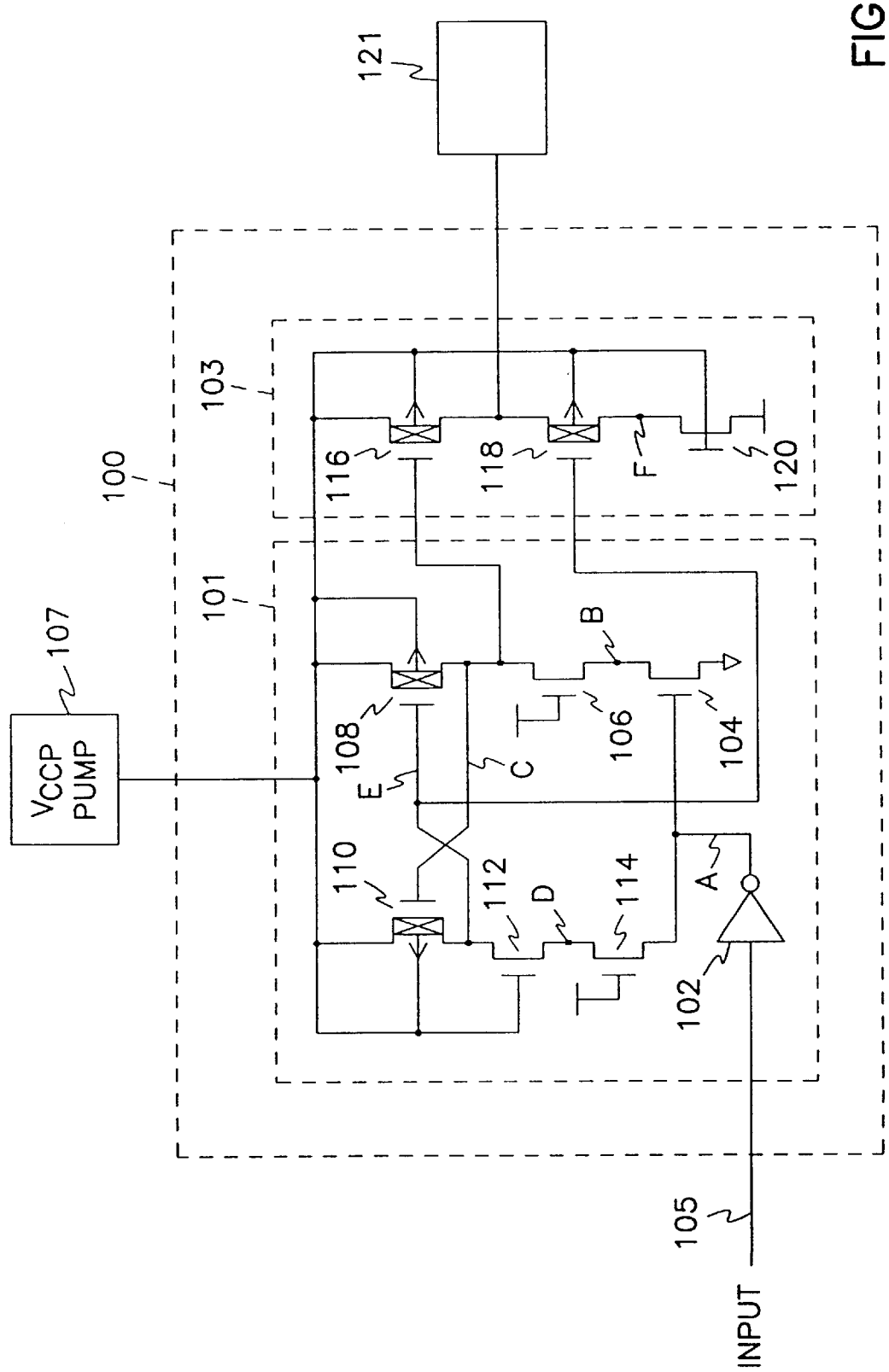
FIG. 1 is a schematic of a voltage level translator.

Referring to FIG. 1, one embodiment of the voltage level translator 100 of the present invention is described. The voltage level translator 100 is comprised of an input stage 101 and an output stage 103. The level translator provides an optional inverter 102 having an input connector 105 to receive a CMOS input voltage signal. The output (node A) of the inverter is connected to the gate of N-channel transistor 104. N-channel transistor 106, having its gate connected to the integrated circuit supply voltage (Vcc), is connected between P-channel transistor 108 and transistor 104 (Node B). The gate of transistor 108 (Node E) is connected to the drain of P-channel transistor 110, which in turn has its gate (Node C) connected to the drain of transistor 108. Both transistors 108 and 110 have their sources connected to a voltage source Vccp, which has a higher voltage potential than Vcc. It will be understood that Vccp can be provided by any supply, including a voltage pump circuit 107. The Vccp pump is provided on the integrated circuit and produces a higher voltage using the Vcc supply voltage, as known to one skilled in the art.

The drain of transistor 110 is connected to the source of N-channel transistor 112. Transistor 112 has its gate connected to Vccp and its drain (Node D) connected to N-channel transistor 114. The gate of transistor 114 is connected to Vcc, while the drain is connected to the output (Node A) of inverter 102.

P-channel transistor 116 is connected such that its gate is connected to Node C and its source is connected to Vccp. Node C and E are referred herein as intermediate outputs of input stage 101. Further, the drain of transistor 116 is connected to the source of P-channel transistor 118. This connection provides the output signal from the voltage level translator 100 and is connected to some additional circuit 121 as further described below.

Transistor 118 has its gate connected to Node E and its drain (Node F) is connected to N-channel transistor 120. Finally, the gate of transistor 120 is connected to Vccp and the drain is connected to Vcc.

Figure 2:
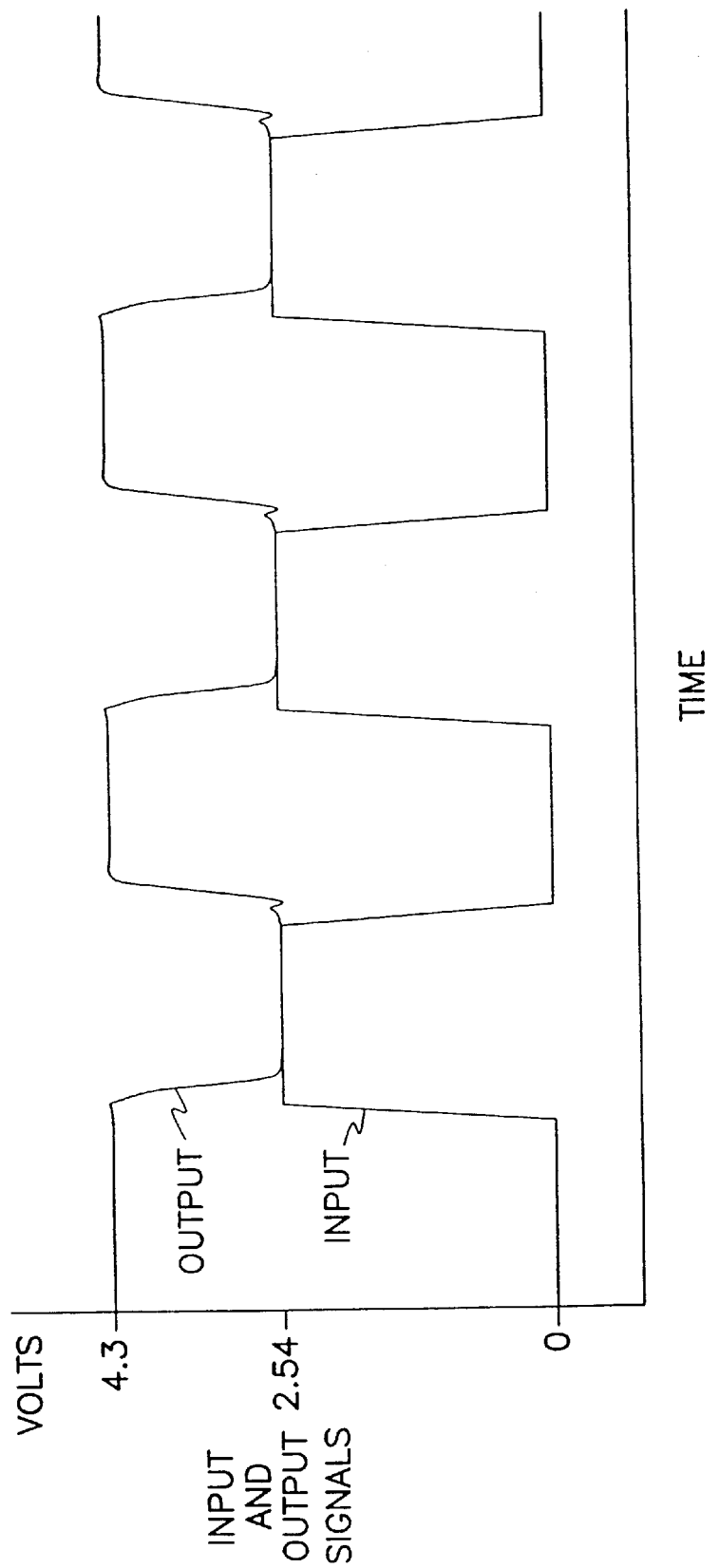
FIG. 2 is a graph showing the input and output voltages of the voltage level translator of FIG. 1.

In operation, the circuit shown in FIG. 1 and described above produces an output substantially as shown in FIG. 2. The input signal shown is a substantially square wave having a low voltage level of 0 and a high voltage level of 2.54 volts. The output signal is a substantially square wave, inverse to the input signal and having a voltage swing between 2.54 and 4.3 volts.

Figure 3:
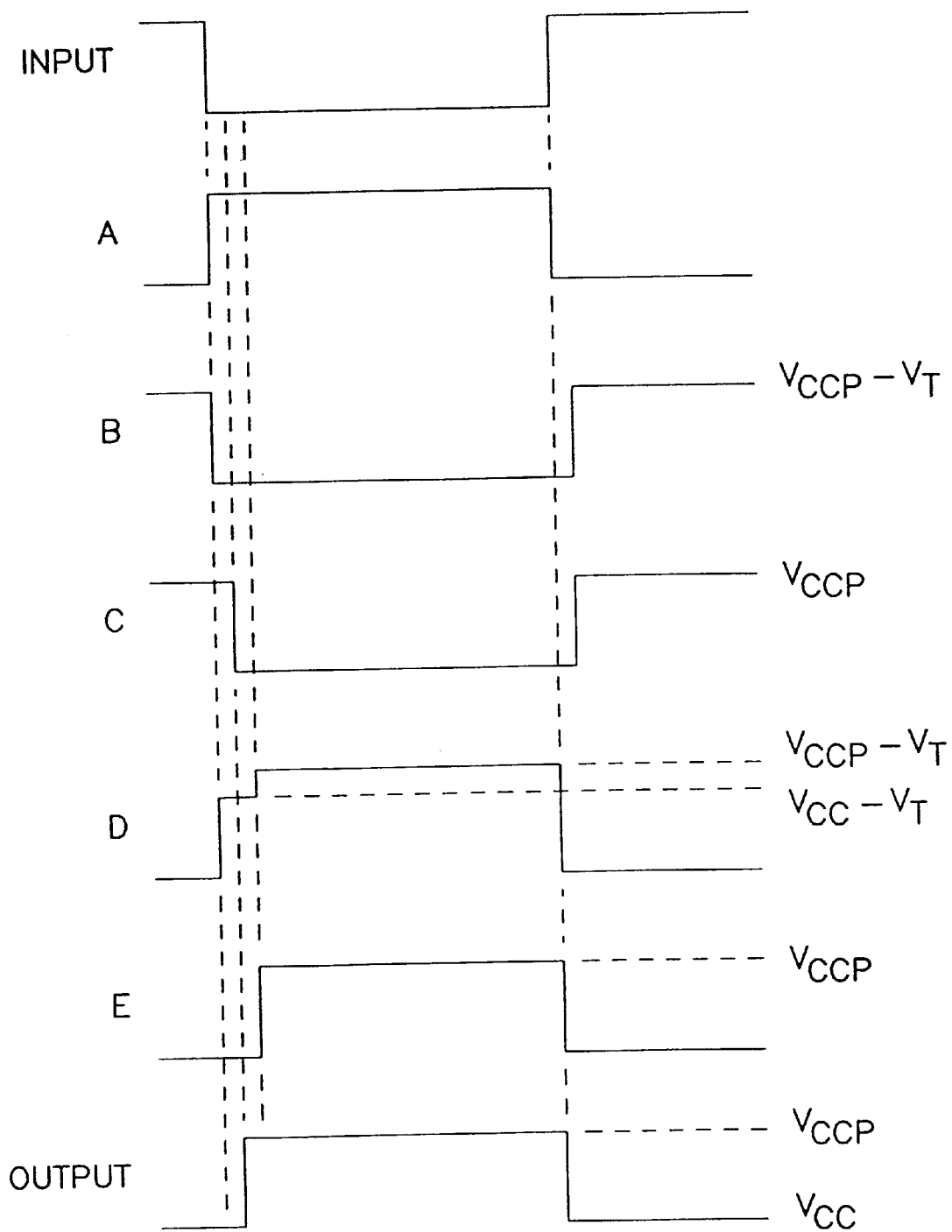
FIG. 3 is a timing diagram of selected modes of the voltage level translator of FIG. 1.

With reference to the circuit of FIG. 1 and the timing diagram of FIG. 3 the operation of the voltage level translator of the present invention will be described. When the state of an input signal to inverter 102 goes from a high voltage to a low voltage, Node A goes from a low voltage to a high voltage. This transition turns on transistor 104, thereby pulling Node B low. Node C is also pulled low through transistors 106 and 104. Node D is initially pulled high through transistor 114 to a voltage of Vcc-Vt, where Vt is the transistor threshold voltage of approximately 0.7 volts. Transistor 110 is activated when Node C goes low and pulls Node E to Vccp. By increasing Node E to Vccp, Node D also increases to Vccp-Vt. Both transistors 108 and 118 are turned off when Node E goes to Vccp. Similarly, Transistor 116 turns on when Node C goes low, thereby making the output signal go high to Vccp.

The output voltage remains at Vccp until the input signal changes state. When the input voltage signal goes from a low to a high state, the output of inverter 102, or Node A, goes low. Transistor 104 is turned off and Node D is pulled low through transistor 114. Node E is also pulled low through transistor 112 as Nodes A and D go low. Transistor 118 is turned on when Node E goes low, thereby, pulling the output signal to Vcc. As Node E is pulled low, transistor 108 is turned on so that Node C is pulled high to Vccp, transistors 110 and 116 are turned off and Node B is, therefore, pulled high to Vcc-Vt. With the gate and drain of transistor 120 connected to Vccp and Vcc, respectively, Node F is always held at Vcc.

Figure 4:
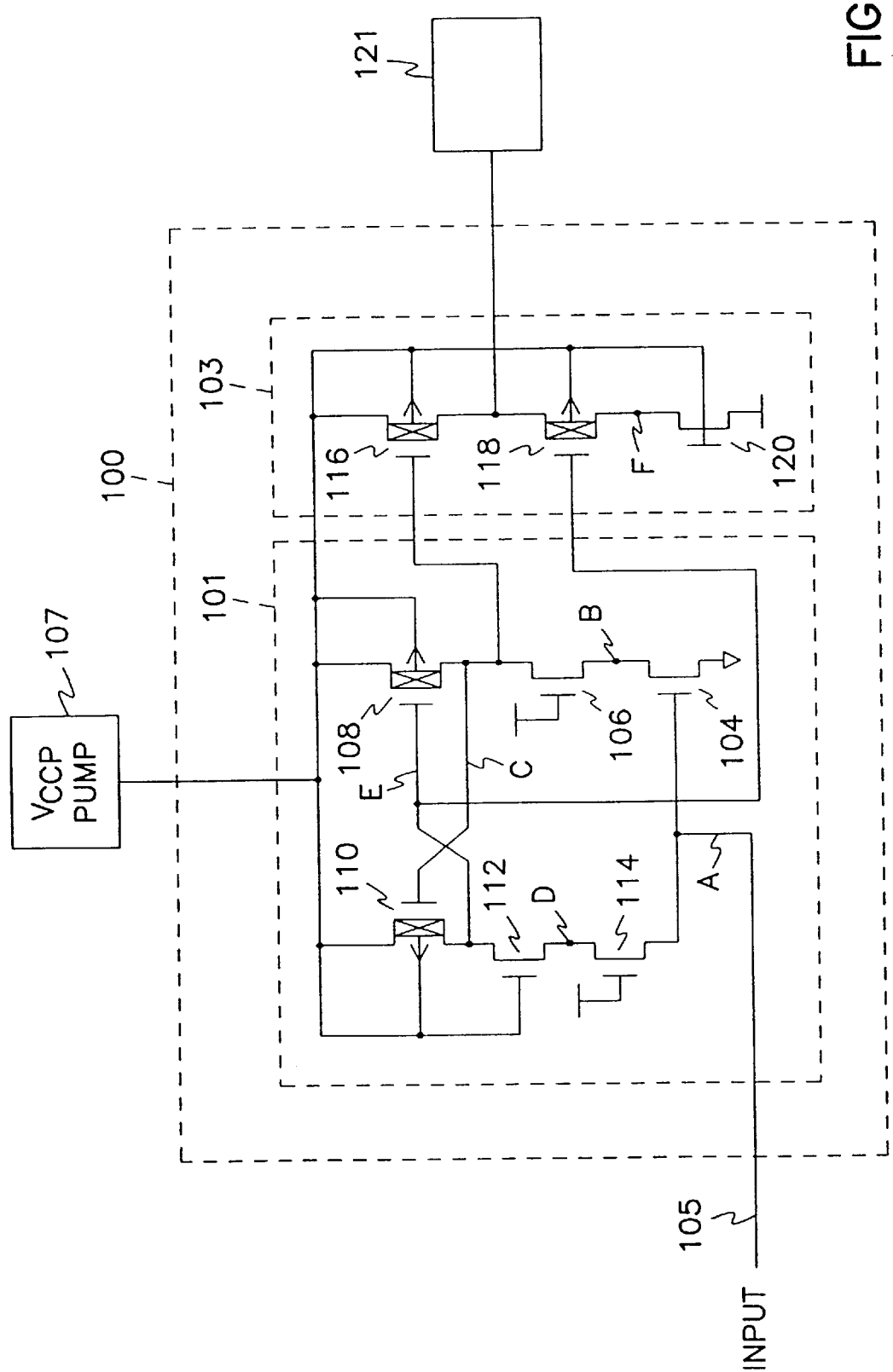
FIG. 4 is a schematic of an alternate voltage level translator.
Figure 5:
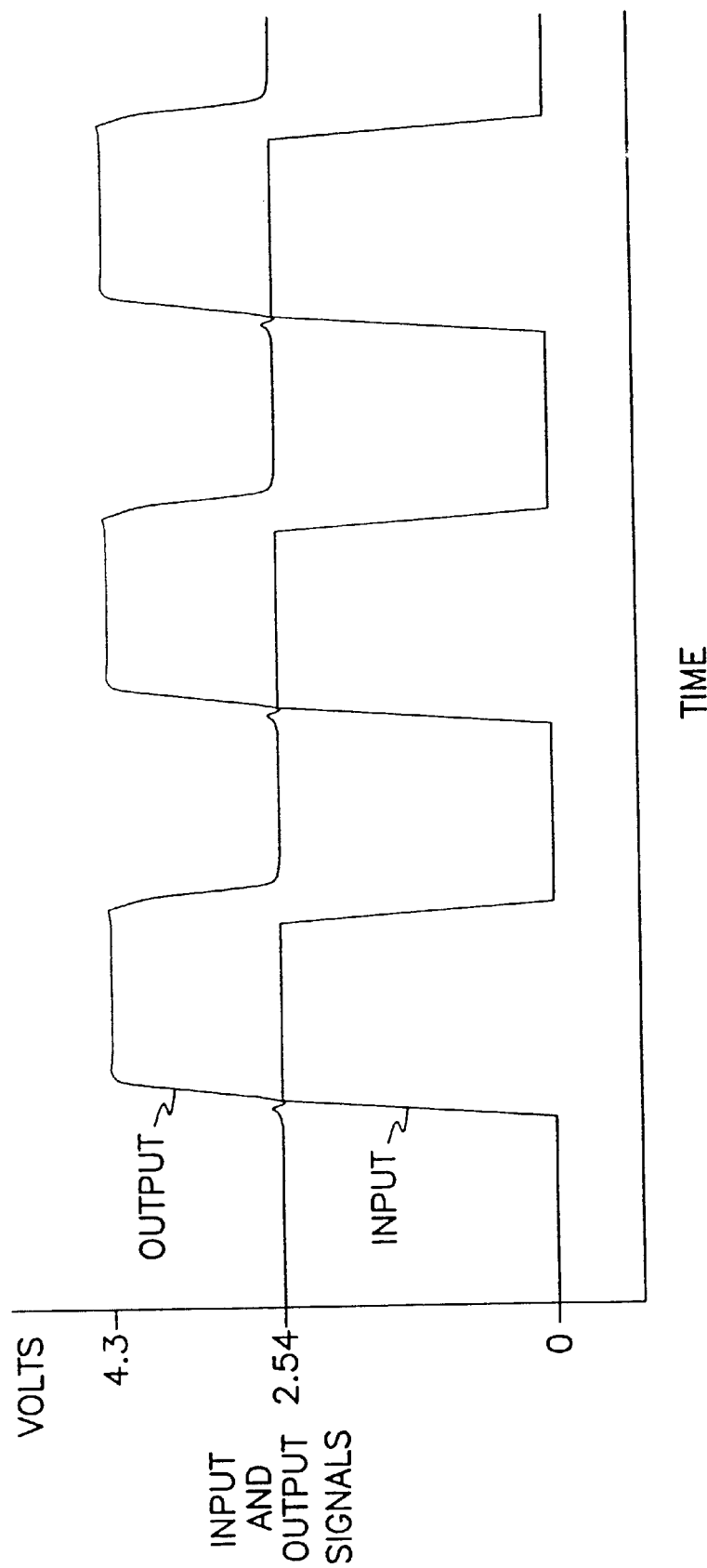
FIG. 5 is a graph showing input and output voltages of the voltage level translator of FIG. 4.

Typical values for Vcc and Vccp are 3 and 4.5 volts, respectively. It will be understood that other voltage levels are contemplated without limiting the scope of the invention. As stated above, inverter 102 is optional. FIGS. 4 and 5 show both an alternative voltage level translator schematic without inverter 102 and the resulting output.

Figure 6:
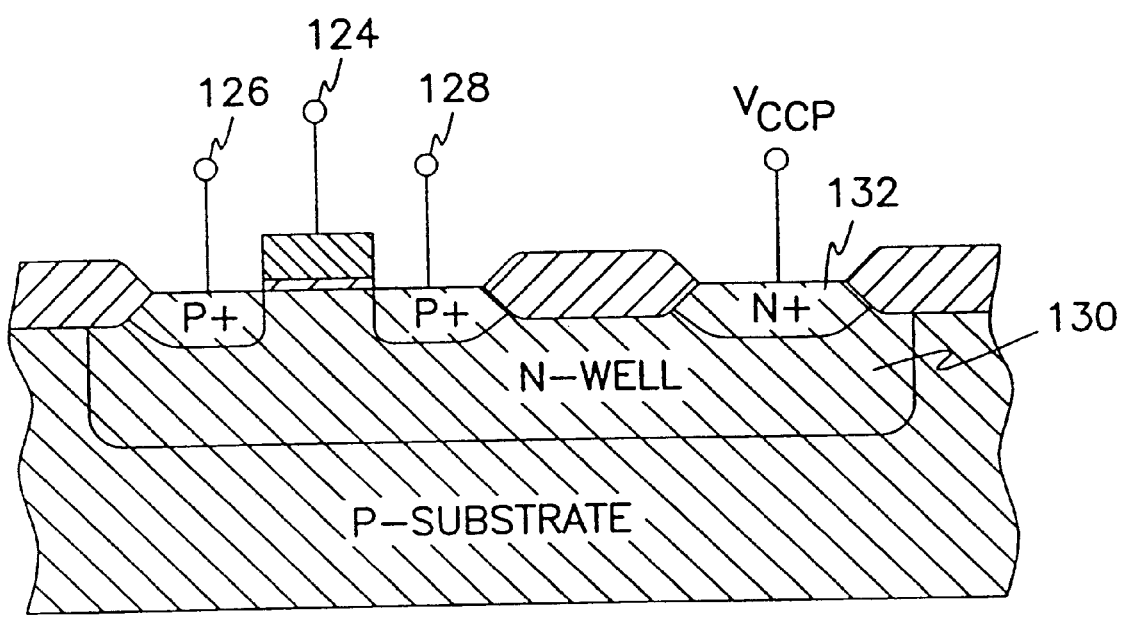
FIG. 6 is a cross-sectional view of a P-channel transistor which may be used in the present invention.

Transistors 108, 110, 116 and 118 are p-channel transistors fabricated as an integrated circuit such that their n-well is connected to Vccp. Referring to FIG. 6, a typical p-channel transistor is shown formed as an integrated circuit having a gate 124, source 126, drain 128 and a n-well 130 connected to Vccp through a N+ region 132. It will be understood that different P-channel structures are contemplated and this example is not intended to limit the present invention.

N-channel transistors 106, 112 and 114 are used as isolation devices and are useful to prevent latch-up. Transistor 106 prevents a large source to drain voltage from occurring across transistor 104. Specifically, as Node C approaches Vccp Node B also approaches Vccp. However, with the gate of transistor 106 connected to Vcc, the transistor will turn off when Node B is at Vcc-Vt. Transistor 106, therefor, prevents the source voltage of transistor 104 from reaching Vccp.

Transistor 114 is used to prevent the inverter 102 from becoming latched-up. That is, the p-channel device in inverter 102 will be forward biased if the inverter output voltage at Node A exceeds Vcc. Transistor 114 operates in the same manner as transistor 106. Transistor 114 will shut off when its drain voltage approaches Vcc-Vt. Node A, however, can be driven to Vcc when the inverter input is low.

Transistor 112 is used to prevent forward biasing transistor 110 during powerup. Both power supplies, Vcc and Vccp, reach their maximum level at different times during power-up. Because Vccp is generated using an on-chip pump generator and Vcc is an external power supply, Vcc will reach its maximum level first. If the drain voltage of transistor 110 exceeds its well voltage (Vccp), the transistor would latch-up. Therefore, transistor 112 holds the drain of transistor 110 below Vccp. Specifically, transistor 112 will shut off if Node D exceeds Vccp-Vt during power-up. Further, it will be understood that transistor 120 protects transistor 118 in a similar manner during power-up. That is, transistor 120 does not allow Node F to exceed Vccp-Vt.

Vbb Level Shifting

Figure 7:
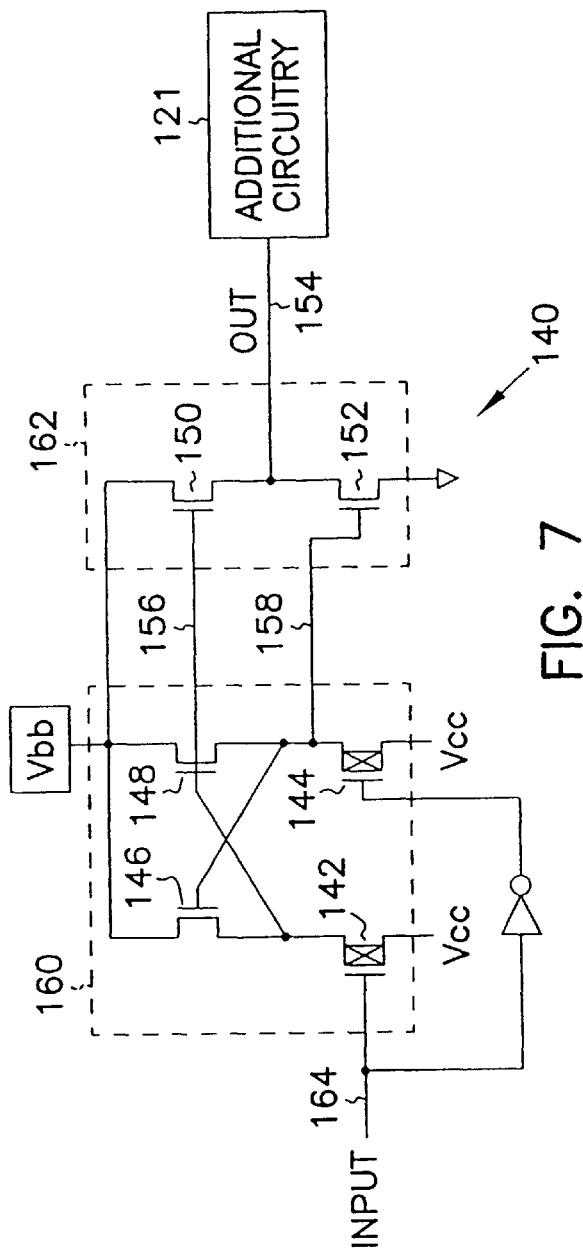
FIG. 7 is a schematic of a voltage level translator of the present invention.

FIG. 7 illustrates one embodiment of a level shifter 140 for shifting an input voltage to a lower voltage level. This level shifter is useful in integrated circuits and in particular to memory circuits for driving, or booting, the gate of a p-channel transistor to a level below ground. The level shifter has an input stage 160 which produces intermediate outputs 156 and 158, and an output stage 162 which produces an output signal on output line 154. The input stage receives an input signal on input line 164. The input signal has an upper positive voltage level and a lower voltage level. The output signal has an upper voltage level equal to the lower voltage level of the input signal, and a lower negative voltage level. Specifically, the present invention can be used to produce an output signal used as a gate voltage on a p-channel transistor in an isolation circuit where the transistor gate voltage needs to vary between ground and a voltage level a Vt below ground to activate and deactivate the p-channel transistor. Additional circuit 121 can be any variety of circuits including but not limited to; isolation circuitry, row or address decoders, or level translated devices. The present invention, therefore, reduces the time and power required to translate an input signal by limiting the voltage swing of the output.

The input stage includes p-channel transistors 142 and 144, and n-channel transistors 146 and 148. The output stage includes n-channel transistors 150 and 152. Transistors 146, 148 and 150 are connected to negative voltage supply Vbb. Likewise, transistors 142 and 144 are connected to positive voltage supply Vcc.

Figure 8:
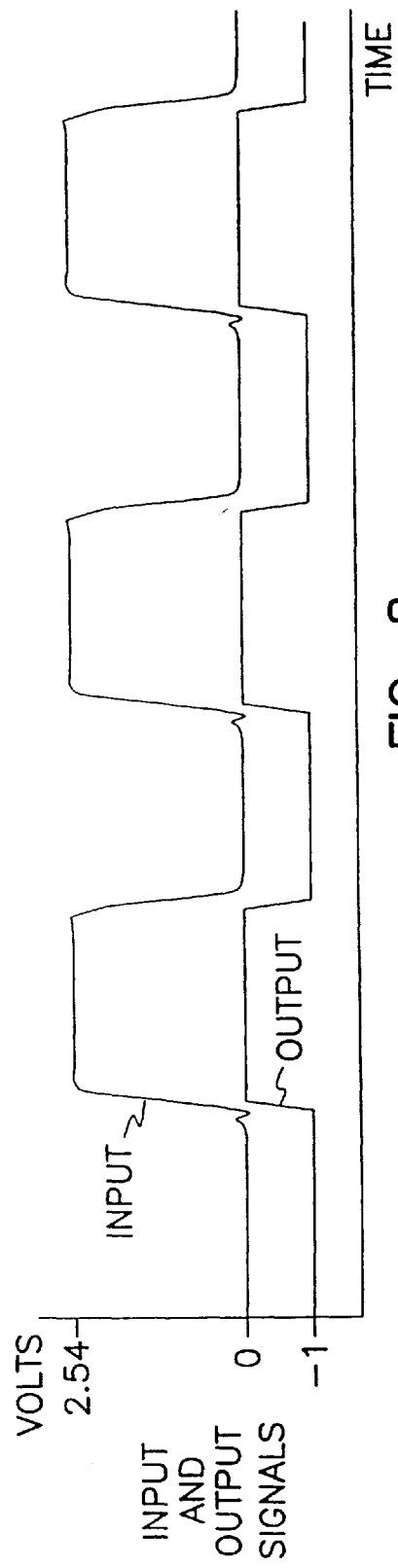
FIG. 8 is a graph showing the input and output voltages of the voltage level translator of FIG. 7.

In operation, an input voltage signal received on input 164 transitioning between Vcc and ground is level shifted to an output voltage signal on output 154 which transitions between ground and Vbb, as illustrated in FIG. 8. The exact voltage levels for Vcc and Vbb are not significant to the present invention, but are preferably around 2.5 volts and −1 volt, respectively. When the input signal is a threshold voltage level below Vcc, transistor 142 is turned on. Similarly, transistor 144 is activated when the inverse of the input signal is a threshold voltage level below Vcc. Transistors 142 and 144 couple the gate of transistors 148 and 146, respectively, to Vcc when active. When transistor 142 is active, transistor 150 is activated to pull the output line 154 to Vbb. When transistor 144 is active, transistor 152 is activated and pulls output line 154 to ground. It will be appreciated that the inverter connected to the gate of transistor 144 can be eliminated by connecting the input 164 to the drain of transistor 144.

Figure 9:
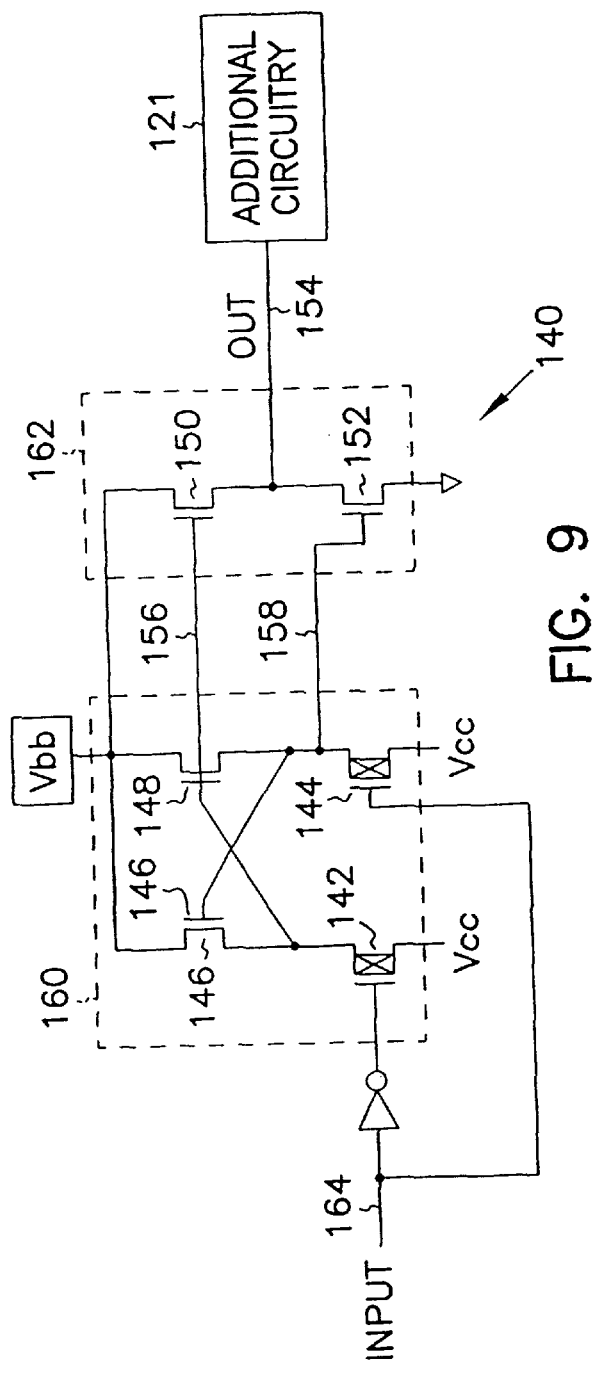
FIG. 9 is a schematic of an alternate voltage level translator of the present invention.
Figure 10:
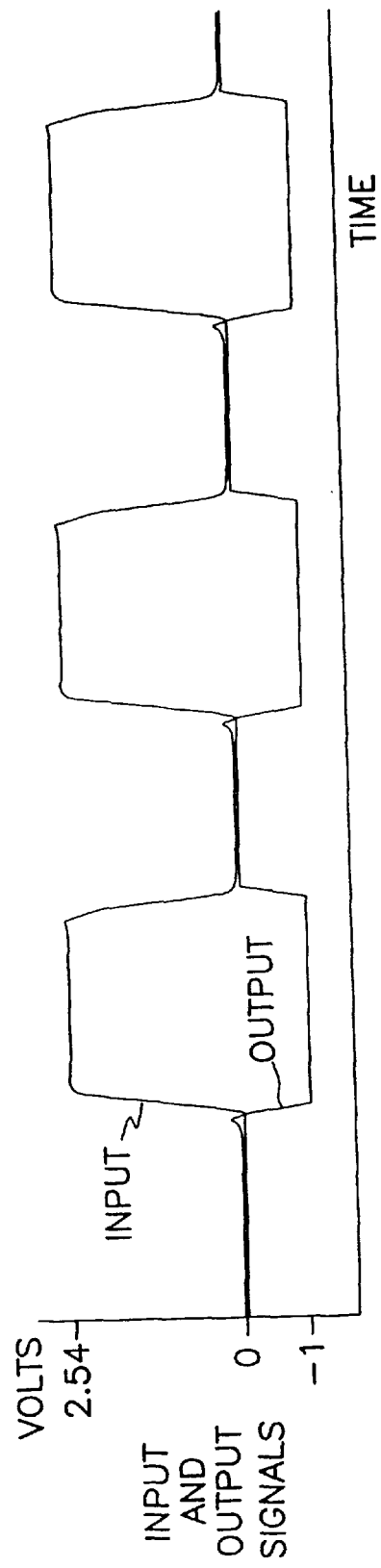
FIG. 10 is a graph showing the input and output voltages of the voltage level translator of FIG. 9.
Figure 11:
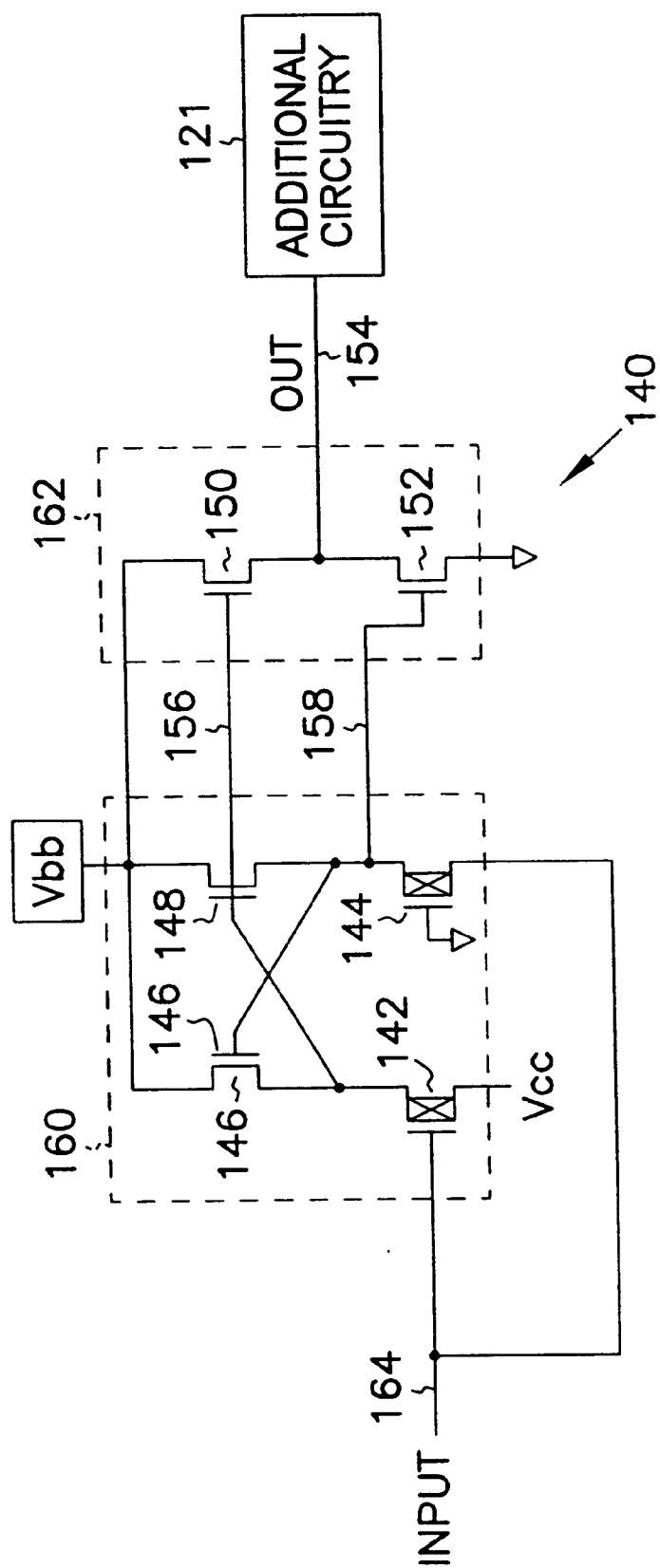
FIG. 11 is a schematic of an alternate voltage level translator of the present invention.

The output signal provided on line 154, therefore, is at Vbb when the input signal is low, and at ground when the input signal is high. It will be appreciated that the signals to the gates of transistors 142 and 144 can be reversed such that the output signal is low when the input is high, see FIGS. 9 and 10.

Conclusion

The present invention provides a voltage level translator capable of translating a input signal into an output signal where the low voltage level of the input signal is equal to the high voltage level of the output signal. This output signal is particularly useful in memory circuits, such as DRAMs. The present invention, therefore, reduces the time and power required to translate an input signal by limiting the voltage swing of the output.

What is claimed is:

1. A voltage level translator comprising:
   an input connection receiving an input signal having a first upper voltage level and a first lower voltage level;
   an input stage producing first and second intermediate outputs, the input stage including:
   a first input transistor having its drain electrically connected to the first upper voltage level, its gate connected to the input connection, and its source electrically connected to the first intermediate output; and
   a second input transistor having its drain connected to the input connection, its gate electrically connected to the first lower voltage level and its source connected to the second intermediate output; and
   an output stage producing an output signal in response to the input signal, the output signal being at a second lower voltage level which is lower than the first lower voltage level when the input is at the first upper voltage level, and at the first lower voltage level when the input is at the first lower voltage level, the output stage having:
   a first output transistor having its gate connected to the first intermediate output, its source electrically connected to the second lower voltage level, and its drain connected to a source of a second output transistor,
   the second output transistor having its gate connected to the second intermediate output, and its drain electrically connected to the first lower voltage level, and
   an output line connected to the drain of the first output transistor.

2. The voltage level translator of claim 1, wherein the first input transistor and the second input transistor comprise p-channel transistors, and wherein the first output transistor and the second output transistor comprise n-channel transistors.

3. The voltage level translator of claim 1, wherein the input stage further comprises:
   a third input transistor having a gate connected to the second intermediate output, a source electrically connected to the second lower voltage level, and a drain connected to the first intermediate output; and
   a fourth input transistor having a gate connected to the first intermediate output, a source electrically connected to the second lower voltage level, and a drain connected to the second intermediate output.

4. The voltage level translator of claim 1, wherein the third input transistor and fourth input transistor comprise n-channel transistors.

5. An integrated circuit operating at a first supply voltage level provided by an external power supply comprising:
   an internal power supply providing a second lower voltage level which is lower than the first lower voltage level;
   a voltage level translator comprising an input connection for receiving an input signal having a first upper signal voltage level equal to the first supply voltage level and a first lower voltage level;
   an input stage producing first and second intermediate outputs, the input stage having:
   a first input transistor having its drain electrically connected to the first upper voltage level, its gate connected to the input connection, and its source electrically connected to the first intermediate output; and
   a second input transistor having its drain connected to the input connection, its gate electrically connected to the first lower voltage level and its source connected to the second intermediate output; and
   an output stage producing an output signal in response to the input signal, the output signal being at the second lower voltage level when the input is at the first upper voltage level, and at the first lower voltage level when the input is at the first lower voltage level, the output stage having:

a first transistor having its gate connected to the first intermediate output, its source electrically connected to the second lower voltage level, and its drain connected to a source of a second transistor;

the second transistor having its gate connected to the second intermediate output, and its drain electrically connected to the first lower voltage level; and an output line connected to the drain of the first transistor; and an additional circuit for receiving the output signal.

6. The integrated circuit of claim 5 where the input stage further comprises:

a third input transistor having a gate connected to the second intermediate output, a source electrically connected to the second lower voltage level, and a drain connected to the first intermediate output; and a fourth transistor having a gate connected to the first intermediate output, a source electrically connected to the second lower voltage level, and a drain connected to the second intermediate output.

7. A method of translating an input signal, comprising:

receiving an input signal, the input signal having a first upper voltage and a first lower voltage level;

producing an output signal in response to the input signal, the output signal being at a second lower voltage level which is lower than the first lower voltage level when the input signal is at the first lower voltage level, and at the first lower voltage level when the input signal is at the first upper voltage level;

producing a first intermediate output and a second intermediate output, the first intermediate output being at substantially the second lower voltage level when the input signal is at the first upper voltage level, the second intermediate output being at the second lower voltage level when the input signal is at the first lower voltage level; and wherein producing an output signal comprises responding to the first and second intermediate outputs, wherein the output signal is at the second lower voltage level when the first intermediate output is at the first lower voltage level, and at the first lower voltage level when the second intermediate output is at the first lower voltage level.

8. A method of translating an input signal, comprising:

receiving an input signal, the input signal having a first upper voltage and a first lower voltage level;

producing an output signal in response to the input signal, the output signal being a second lower voltage level which is lower than the first lower voltage level when the input signal is at the first upper voltage level, and at the first lower voltage level when the input signal is at the first lower voltage level;

producing a first intermediate output and a second intermediate output, the first intermediate output being at the first lower voltage level when the input signal is at the first upper voltage level, the second intermediate output being at the first lower voltage level when the input signal is at the first lower voltage level; and wherein producing an output signal comprises responding to the first and second intermediate outputs, wherein the output signal is at the second lower voltage level when the first intermediate output is at the first lower voltage level, and at the first lower voltage level when the second intermediate output is at the first lower voltage level.

* * * * *